United States Patent
Brown

(10) Patent No.: US 7,131,103 B2
(45) Date of Patent: Oct. 31, 2006

(54) CONDUCTOR STACK SHIFTING

(75) Inventor: Jeffrey S. Brown, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 338 days.

(21) Appl. No.: 10/793,055

(22) Filed: Mar. 4, 2004

(65) Prior Publication Data

US 2005/0198608 A1    Sep. 8, 2005

(51) Int. Cl.
*G06F 17/50* (2006.01)
(52) U.S. Cl. ............ 716/19; 716/1; 716/2; 716/4; 716/20; 716/21
(58) Field of Classification Search ............ 716/1, 716/2, 12, 19, 20, 21; 355/53; 430/5
See application file for complete search history.

(56) References Cited

U.S. PATENT DOCUMENTS

| | | | | |
|---|---|---|---|---|
| 5,602,619 | A * | 2/1997 | Sogard ............ | 355/53 |
| 5,854,125 | A * | 12/1998 | Harvey ............ | 438/626 |
| 5,967,804 | A * | 10/1999 | Yoshizawa et al. ........ | 439/91 |
| 6,368,972 | B1 * | 4/2002 | Maury et al. ............ | 438/692 |
| 6,604,233 | B1 * | 8/2003 | Vickery et al. ............ | 716/19 |
| 6,634,018 | B1 * | 10/2003 | Randall et al. ............ | 716/19 |
| 6,710,851 | B1 | 3/2004 | Elmer et al. | |
| 6,858,356 | B1 * | 2/2005 | Savaria et al. ............ | 430/5 |
| 6,957,402 | B1 * | 10/2005 | Templeton et al. ........ | 716/2 |
| 6,964,030 | B1 * | 11/2005 | Hong et al. ............ | 716/12 |
| 2003/0223630 | A1 * | 12/2003 | Adel et al. ............ | 382/145 |
| 2004/0199895 | A1 * | 10/2004 | Hong et al. ............ | 716/19 |
| 2005/0086617 | A1 * | 4/2005 | Ciplickas et al. ............ | 716/4 |
| 2005/0196680 | A1 * | 9/2005 | Bouche et al. ............ | 430/5 |
| 2005/0276211 | A1 * | 12/2005 | Hirotsune et al. ........ | 369/272.1 |
| 2006/0062445 | A1 * | 3/2006 | Verma et al. ............ | 382/144 |

FOREIGN PATENT DOCUMENTS

JP    2005268245 A  *  9/2005

\* cited by examiner

*Primary Examiner*—A. M. Thompson
*Assistant Examiner*—Helen Rossoshek
(74) *Attorney, Agent, or Firm*—Luedeka, Neely & Graham, P.C.

(57) ABSTRACT

A method for integrating a first integrated circuit design having first layers and a second integrated circuit design having second layers into a common reticle set. The second integrated circuit design has a given number of second layers and the first integrated circuit design has less than the given number of layers. At least one of the first layers is duplicated to produce at least one duplicated first layer until the first integrated circuit design has the given number of layers. The first layers and the at least one duplicated first layer are mapped to a modified first integrated circuit design having the given number of first layers. A reticle set is fabricated to include the given number of first layers and second layers, using the modified first integrated circuit design and the second integrated circuit design.

17 Claims, 4 Drawing Sheets

CONDUCTOR STACK SHIFTING

FIELD

This invention relates to the field of integrated circuit fabrication. More particularly, this invention relates to fabricating integrated circuits with different conductor stack heights on a common substrate using a common reticle set.

BACKGROUND

Many modern integrated circuits are fabricated using a design technology that is generally referred to as application specific integrated circuit technology, or ASIC technology. ASIC technology starts with a library of functional modules and standard processes, which are combined in a variety of different ways to produce unique integrated circuits. Thus, a customer can select from the functional modules offered by an ASIC fabricator to design an integrated circuit that is highly customized according to the needs of the customer's products. By using such technology, the cost of fabricating integrated circuits is dramatically reduced.

However, even though some costs can be dramatically reduced using such technology, other costs are not reduced to such a large extent. For example, one of the major costs of fabricating a unique integrated circuit design is the tooling cost associated with producing a mask or reticle set for the design. Although standard functional modules have been used in the design of the integrated circuit, these functional modules are combined into a unique reticle set in order to fabricate the new design. If a relatively large number of the integrated circuits are to be fabricated, these tooling costs can be spread across a great number of individual devices, and thus are relatively low on a per device basis. However, if only a relatively limited number of the integrated circuits are to be fabricated, then these tooling costs comprise a relatively greater economic load on each individual device so fabricated.

The cost of tooling, such as reticle sets, can be reduced by placing more than one integrated circuit design on each reticle of the reticle set. When this is done, then each design is fabricated on common substrates using the common reticle set. However, in order for this to work, certain conditions must be met. For example, it must be possible to appropriately singulate the different devices from one another when the fabrication process is complete. However, this is not too high a barrier, as there are many integrated circuit designs which meet this criteria.

Unfortunately, even though those criteria such as the ability to singulate may be met, other criteria might still prohibit two or more integrated circuit designs to be integrated into a common reticle set. For example, there may be processing differences between the two designs. Sometimes these processing differences are extreme, and thus the integration of the two different designs is not practical. However, other times the processing differences do not seem that great, yet a few seemingly small differences still prohibit the integration of the two or more designs into a single common reticle set.

For example, two different designs may be extremely similar, or virtually identical, in their processing requirements (not in their layout), except that one of the designs has a different conductive stack than the other design. For example, one of the designs may have a taller conductive stack, and the other design therefore has a shorter conductive stack. Although this may be the only difference in processing between the two different designs (remembering that the layout of the two designs may be vastly different), if has nevertheless been a sufficient difference to prohibit the integration of the two different designs into a common reticle set, because the taller stack design required more layers than the shorter stack design.

What is needed, therefore, is a system by which different integrated circuit designs which have different stack heights, but which otherwise have compatible process flows, can be integrated into a common reticle set and be fabricated on common substrates.

SUMMARY

The above and other needs are met by a method for integrating a first integrated circuit design having first layers and a second integrated circuit design having second layers into a common reticle set. The second integrated circuit design has a given number of second layers and the first integrated circuit design has less than the given number of first layers. At least one of the first layers is duplicated to produce at least one duplicated first layer until the first integrated circuit design has the given number of first layers. The first layers and the at least one duplicated first layer are mapped to a modified first integrated circuit design having the given number of first layers. A reticle set is fabricated to include the given number of first layers and the given number of second layers, using the modified first integrated circuit design and the second integrated circuit design.

In this manner, additional layers are added to the first integrated circuit design until it has the same number of relevant layers as the second integrated circuit design. Thus, both of the integrated circuit designs can be included on a single common reticle set, and be fabricated on a common substrate. By so doing, the costs of fabricating the reticle set can be apportioned between the two different integrated circuit designs, which tends to lower the tooling costs, and thereby the overall costs, associated with fabricating the two different integrated circuit designs.

In various embodiments, the first layers and the second layers are conductive stack layers. The first layers and the second layers preferably include thin metal layers and via layers of the conductive stacks. Preferably, the duplicated at least one of the first layers includes a topmost of the first layers. In some embodiment, first elements are selectively redacted from the at least one duplicated first layer. In additional embodiments, first elements from the at least one duplicated first layer are selectively redacted, and second elements are selectively added to the at least one duplicated first layer.

Also described is a reticle set fabricated with the method described above.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
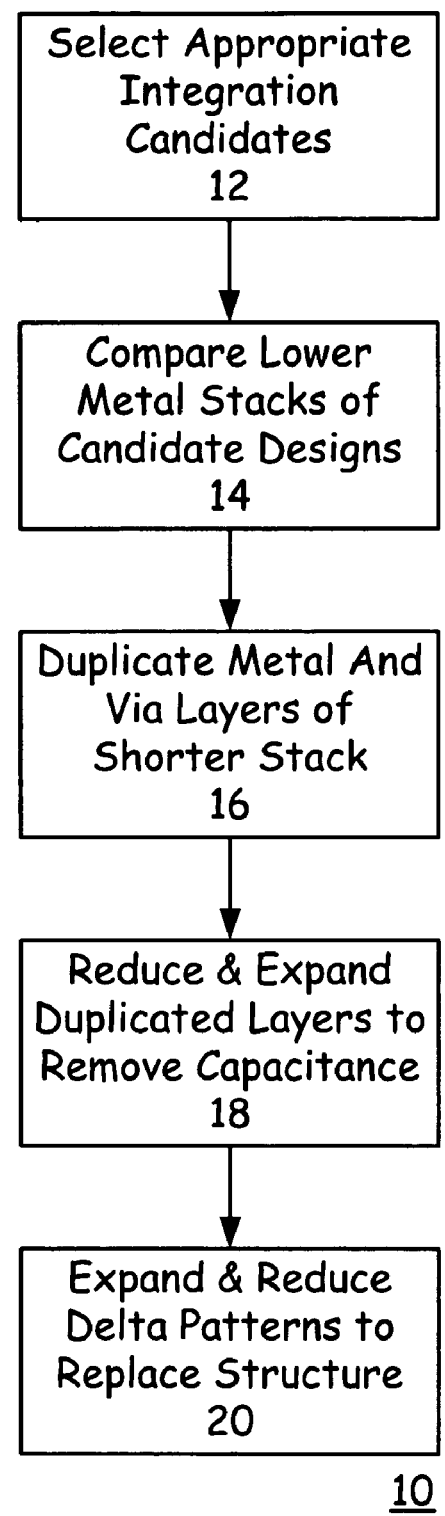
FIG. 1 is a flow chart of a method according to a preferred embodiment of the invention.

With reference now to FIG. 1, there is depicted a flow chart of a method 10 according to a preferred embodiment of the invention. First, various integrated circuit designs are evaluated to determine which designs are appropriate candidates for integrating, one with another, onto a common reticle set. As introduced above, those designs which are appropriate candidates can be fabricated using the common reticle set on a common substrate. The integrated circuits described herein are preferably monolithic semiconducting integrated circuits, such as MOS devices formed on substrates of group IV materials such as silicon or germanium or mixtures of such, or group III–V materials such as gallium arsenide. Integrated circuits including devices of any type are contemplated, such as logic or memory.

For the purposes of the present invention, appropriate candidate designs are those which can be properly singulated one from another when the common substrate is diced at the completion of the fabrication process. Thus, such candidate designs will have certain commonalities in die size and overall processing. However, such candidate designs do not need to be identical.

As mentioned above, there may exist many candidate designs that are otherwise appropriate for fabrication using a common reticle set on a common substrate, but which could not be commonly fabricated because of the difference in their conductive stack architectures. Specifically, some device designs have a taller conductive stack than other device designs. If such a condition exists between two or more designs that could otherwise by commonly processed, then the various embodiments of the present invention are particularly applicable to such situations.

When such a condition exists, the conductive stacks of the two or more designs are preferably compared, as given in block 14 of FIG. 1. It is appreciated that the methods as described herein may be applied to many different device designs, where it is desired to integrated the many different device designs into a common reticle set for fabrication on a common substrate. However, so as to not unduly burden the description and figures with repetitive detail, the descriptions of the various embodiments as made herein are presented for the specific case of integrating two different device designs. However, the present invention is not limited to the integration of just two different device designs.

The comparison between the two conductive stacks is more specifically made between what is generally referred to as the lower metal layers of the stacks, which are also referred to as the thin metal layers of the stacks. It is appreciated that, as used herein, the term "thin" is not a limitation on the thickness of the metal layers, but is rather a designation of the metal layers referred to, as understood by those familiar with the field of art. Although the electrically conductive elements of the conductive stacks may be formed of any suitable electrically conductive material, metal is most preferably used. However, it is appreciated that the present invention is not to be limited to the specific case where metal or metal containing materials are used as the electrically conductive elements of the conductive stacks.

Many integrated circuit designs employ such lower or thin metal layers in the conductive stack. On top of the lower thin metal layers there is preferably a layer that is called a thick metal layer. Again, the term "thick" is not meant to imply a thickness limitation, but rather is a designation of a given stack layer that is recognized as such by those familiar with the field of art. Overlying the thick metal layer there may be other metal layers, generally referred to as R layers, which tend to be quite similar from one integrated circuit design to another. Thus, it is more typically the thin metal layers of the conductive stack that differ from one integrated circuit design to another. Therefore, the embodiments described herein are more specifically presented in regard to the lower thin metal layers. However, it is appreciated that the various methods as described herein are also applicable to other metal layers besides the thin metal layers, and the invention is not to be limited to use with just the thin metal layers.

Figure 2:
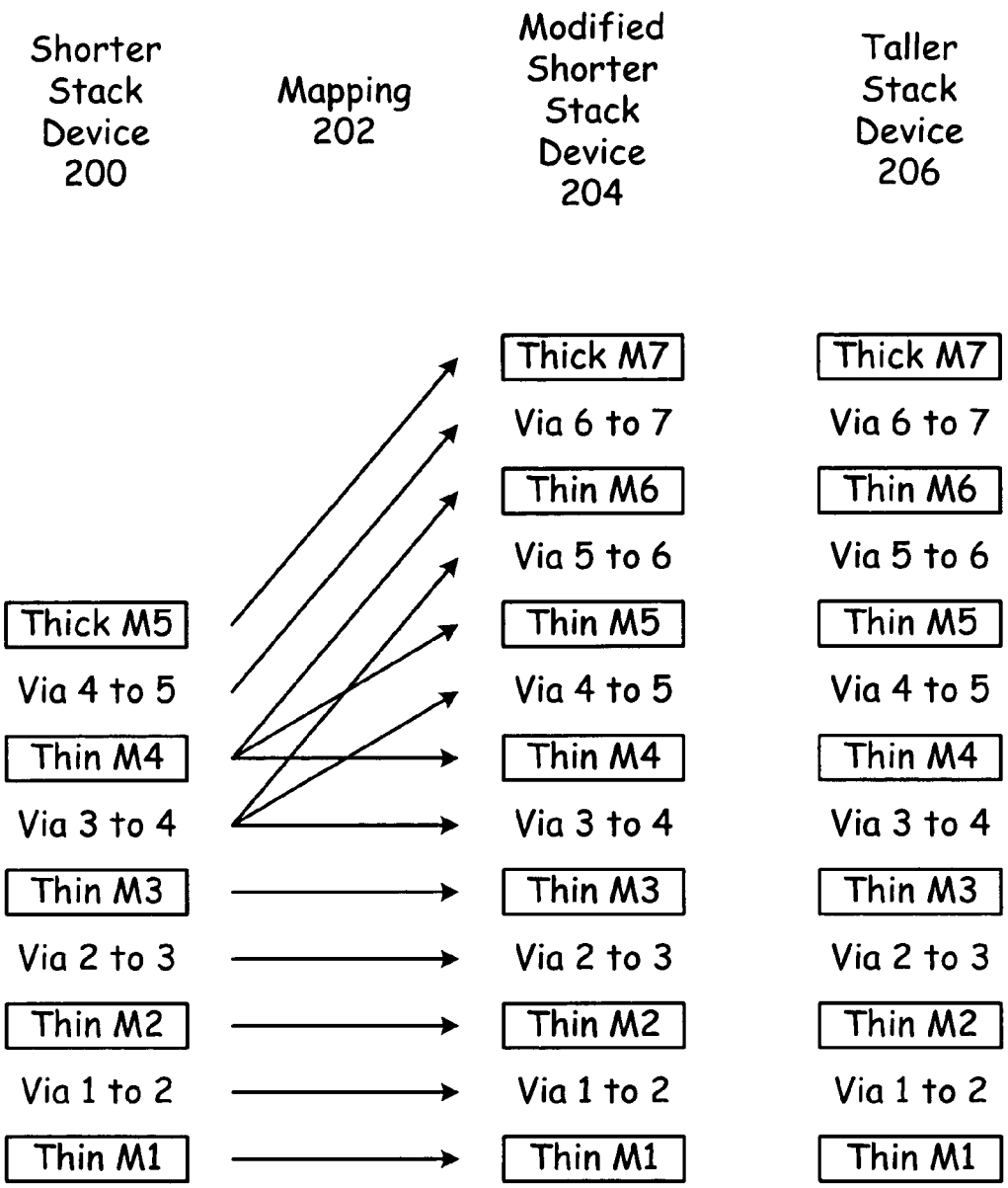
FIG. 2 depicts the duplication and mapping of the topmost thin metal layer and associated overlying via layer for the shorter stack device, according to a preferred embodiment of the present invention.

The difference between the thin metal layers of a first integrated circuit design and the thin metal layers of a second integrated circuit design, besides the obvious difference of routing patterns, is that one of the first or second designs may have a greater number of metal layers, as mentioned above. FIG. 2 depicts a situation where it is desired to integrate a shorter stack device, as represented by the layers depicted in column 200, with a taller stack device, as represented by the layers depicted in column 206. As can be seen in FIG. 2, the shorter stack device 200 has four thin metal layers, 1–4, with associated via layers disposed between the four thin metal layers. However, the taller stack device 206 has six thin metal layers, 1–6, with associated via layers disposed between the six thin metal layers.

Each of the two designs 200 and 206 has a thick metal layer overlying the thin metal layers, however, the thick metal layer of the shorter stack device 200 is the fifth layer, and the thick metal layer of the taller stack device 206 is the seventh layer. It is noted that the via layer immediately underlying the thick metal layer, regardless of the height of the thin metal stack, is preferably different from the via layers that exist between two thin metal layers. For the purposes of the present example, it is understood that there are additional layers of each of the two integrated circuit designs 200 and 206 that exist both below the first thin metal layers and above the thick metal layers. It is further understood that such additional layers have compatible processing between the two integrated circuit designs 200 and 206.

To integrate the two different designs 200 and 206 into a common reticle set, at least one metal layer and one via layer, and most preferably only one metal layer and only one via layer, of the shorter stack device 200 are duplicated and mapped to a modified shorter stack device design 204, as given in block 16 of FIG. 1. The modified shorter stack design 204 preferably has the same number of thin metal layers and the same number of intervening via layers as the taller stack device 206, as depicted in FIG. 2. Most preferably, the duplicated layers are the uppermost thin metal layer and the via layer which is disposed immediately below the uppermost thin metal layer. In the example as depicted in FIG. 2, this duplicated thin metal layer is the fourth metal layer, or the M4 layer, and the duplicated via layer is the via layer between the third thin metal layer and the fourth thin metal layer.

As depicted by the mapping indications of column 202 in FIG. 2, all layers, both metal layers and via layers, which underlie the uppermost thin metal layer and the immediately underlying via layer are mapped directly across to their corresponding layers in the modified shorter stack device 204. However, as can be seen in column 202, the uppermost thin metal layer is preferably duplicated as necessary, in conjunction with the underlying via layer, as many times as necessary to make up the difference in the number of metal layers between the shorter stack device 200 and the taller stack device 206. In the present example as depicted in FIG. 2, this means that the uppermost thin metal layer and its underlying via layer are duplicated three times each when mapped to the modified shorter stack device 204. However, this number of duplications could be fewer or more depending upon the difference in the number of thin metal layers between the shorter stack device 200 and the taller stack device 206.

It is also appreciated that the specific example as described herein has only a single metal layer and a single via layer duplicated in order to compensate for the disparity between the number of metal layers in the short stack device 200 and the tall stack device 206. In other embodiments, more than one thin metal layer and its associated via layer could be duplicated to compensate for the disparity. Alternately, a layer other than the uppermost thin metal layer and its associated via layer could be duplicated to compensate for the disparity. However, most preferably, only the uppermost thin metal layer and its immediately underlying via layer are so duplicated to compensate for the disparity. Thus, as depicted in FIG. 2, both the modified short stack device 204 and the tall stack device 206 have the same number of thin metal layers, which in the example as depicted is six.

Unfortunately, the duplication of metal layers in the modified short stack device 204 tends to produce problems with some integrated circuit designs. For example, such redundant metal layers tend to introduce a certain amount of additional capacitance in some applications. For some types of electrically conductive elements, such as power or ground elements which are preferably held at a give voltage potential, such capacitance is not unwelcome, and may even be a benefit. However, for other types of electrically conductive elements, such as signal lines that typically need to change potential at an extremely high rate of speed, such capacitance is especially unwelcome, and tends to detract from the overall performance of the integrated circuit.

Thus, according to the preferred embodiments of the method according to the present invention, one or more, and most preferably all of the duplicated layers are modified to remove some of the redundant elements, as given in block 18 of FIG. 1. Most preferably, the directly mapped instance of the duplicated thin metal layer is fabricated in the form as it is originally designed, while the duplicated overlying layers are modified as described below. Thus, as depicted in FIG. 2, the thin M4 layer of the modified short stack device 204 is preferably formed as originally designed in the thin M4 layer of the short stack device 200. However, when the thin M4 layer of the short stack device 200 is duplicated to the thin M5 layer and the thin M6 layer of the modified short stack device 204, it is preferably modified in each instance as described below.

Figure 3A:
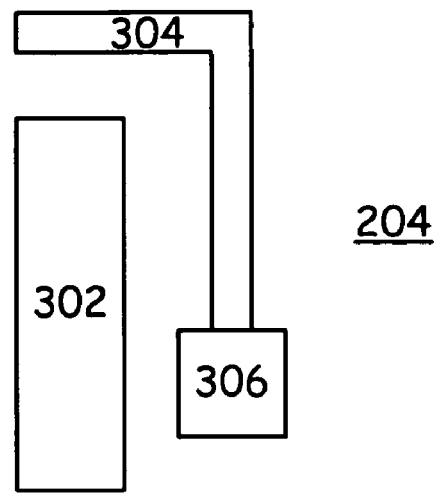
FIG. 3A depicts a minimum route width metal element and wider route width metal elements from a duplicated layer, according to a preferred embodiment of the present invention.

FIG. 3A depicts a duplicated layer of the modified short stack device 204. A few different elements on the metal layer are represented, including a minimum route width metal element 304 and wider route width metal elements 302 and 306. The minimum route width metal element 304 represents an electrically conductive element such as a signal trace, in which the additional capacitance of the duplicated layers in undesirable. The wider metal elements 302 and 206 respectively represent electrically conductive elements such as a wider power bus and a via surround, in which the additional capacitance is generally not detrimental.

Figure 3B:
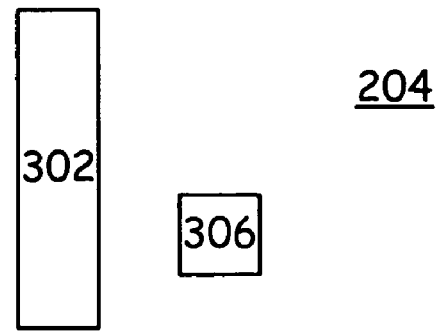
FIG. 3B depicts the metal elements from the duplicated layer that have been reduced by at least the minimum route width, which redacts the minimum route width metal elements, according to a preferred embodiment of the present invention.

The first stage of the process by which the layer is modified preferably includes reducing the feature size of the elements of the duplicated layer as depicted in FIG. 3B to a point where the elements that add unwanted capacitance, or other unwanted properties, are redacted. Preferably, this is done using a design tool, and by reducing the size of all elements by at least, and preferably by exactly, the minimum route width of an element to be redacted. As depicted in FIG. 3B, such a reduction of feature sizes completely removes the detrimental element 304, while merely reducing in size the elements 302 and 306 which are not adverse to the proper operation of the integrated circuit, or which are essential to the operation of the integrated circuit, such as by permitting electrical continuity between the duplicated layers.

Figure 3C:
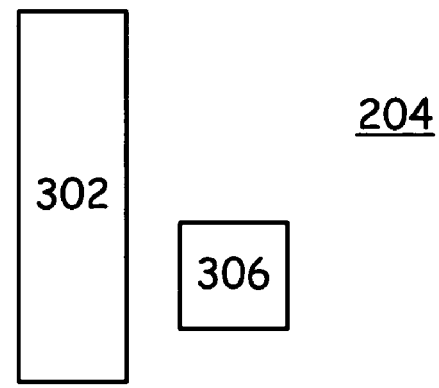
FIG. 3C depicts the metal elements from a duplicated and redacted layer that have been expanded to return the remaining metal elements to their original size, according to a preferred embodiment of the present invention.

Although in some embodiments the modification of the duplicated layer could end at this point, additional modifications are most preferably performed. As depicted in FIG. 3C, the elements that have remained after the feature reduction has redacted the smaller elements are preferably expanded, most preferably to a point where they are at their original size. Thus, in this state, the larger elements 302 and 306 remain on the duplicated layer, while the smaller elements such as 304 have been redacted. Thus, this portion of the method according to a preferred embodiment of the invention generally reduces the effects of capacitance and other problems that may be introduced by the duplicated metal layers.

Figure 4A:
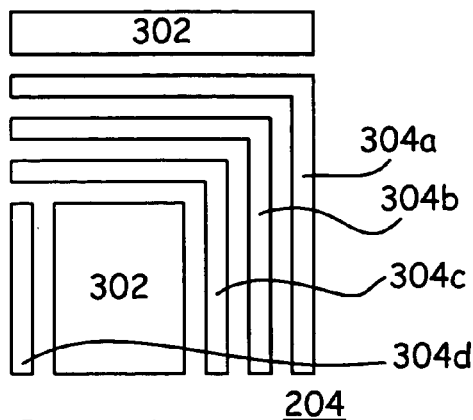
FIG. 4A depicts minimum route width metal elements that are grouped together in a duplicated layer, according to a preferred embodiment of the present invention.
Figure 4B:
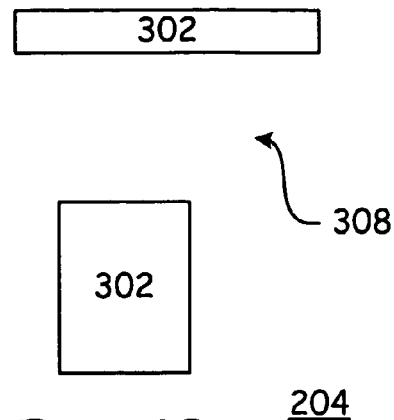
FIG. 4B depicts the remaining metal elements from a duplicated, redacted, and expanded layer, according to a preferred embodiment of the present invention, where a large field exists in place of the redacted metal elements.

As depicted in FIG. 4A, there are some instances on duplicated layers where there are groups of small features, such as lines 304a–304c, which are preferably redacted, as depicted in FIG. 4B. However, when such groups of small features are so redacted, a relatively large field 308 is created. In some integrated circuit designs, the metal lines that are redacted were intended to provide structural support for the integrated circuit, in addition to providing electrical pathways. When such groups of metal lines are redacted, the structural support which they provided is likewise removed, which may weaken the structural integrity of the integrated circuit. Thus, according to a preferred embodiment of the present invention, a new element is created to provide the structural support, as given in block 20 of FIG. 1.

Figure 4C:
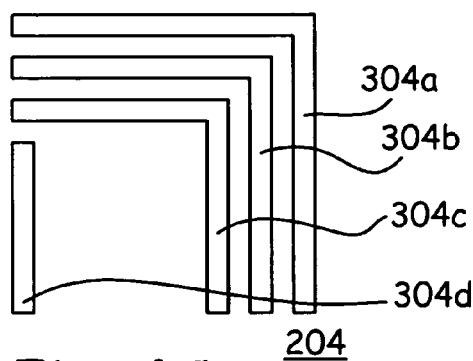
FIG. 4C depicts a delta layer including the redacted metal elements in their original size as they were removed from a duplicated and redacted layer, according to a preferred embodiment of the present invention.
Figure 4D:
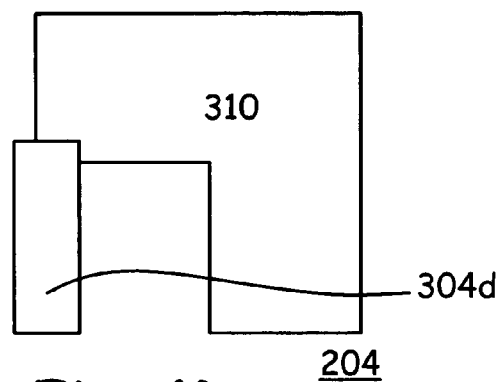
FIG. 4D depicts the metal elements of the delta layer as they are expanded by the spacing between the grouped minimum route width metal elements to form a merged metal element, according to a preferred embodiment of the present invention.

This is most preferably accomplished by defining a delta layer, as depicted in FIG. 4C. The delta layer includes those elements which have been removed from the modified layer during the process as described above, in their original sizes. These relatively smaller elements of the delta layer are preferably expanded, as depicted in FIG. 4D, to a point where the group of smaller elements, such as lines 304a–304c, merge together into a single merged element 310. This is preferably accomplished by using a design tool, and by expanding the feature size by at least, and preferably by exactly, the spacing between the grouped minimum route width metal elements.

Figure 4E:
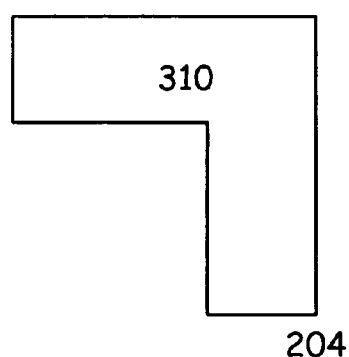
FIG. 4E depicts the merged metal element after reducing the delta layer, according to a preferred embodiment of the present invention.

The remaining elements, 304d and 310 as depicted in FIG. 4D, are preferably next reduced in size to a point where the minimum route width element 304d is removed, as depicted in FIG. 4E, which leaves just the merged element 310 on the delta layer. This can be accomplished in a variety of ways. One such method would be to reduce the expanded elements as depicted in FIG. 4D by the same amount by which they were previously expanded. This would produce a merged element 310 having generally the same size as the grouped elements 304a–304c, and the element 304d. These elements could then be reduced and expanded by the width of the element 304d, in a manner similar to that described above, which would redact the element 304d and leave just the merged element 310 on the delta layer. Other methods are also possible within the scope of the present invention.

Figure 4F:
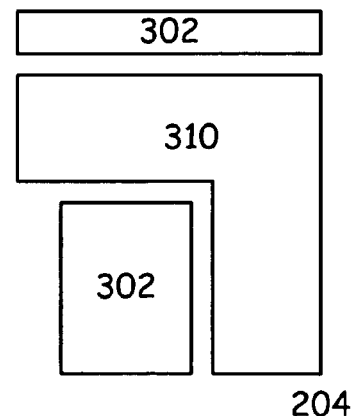
FIG. 4F depicts the remaining metal elements from the duplicated, redacted, and expanded layer as they are combined with the merged metal element, according to a preferred embodiment of the present invention.

Finally, the remaining merged element 310 of the delta layer is combined with the remaining elements as they existed on the duplicated layer, as depicted in FIG. 4B, producing the layer as depicted in FIG. 4F. As can be seen in FIG. 4F, the elements 302 are present, most preferably in their original size, and the merged element 310 is also present, which is available to provide structural support within the duplicated layer for the integrated circuit. The merged element 310 is preferably the size of the grouped elements 304a–304c with the spacing between them filled in.

Most preferably, such merged elements are further modified so that they do not connect to the via surrounds, which would tend to short many different signal lines together. Alternately, all smaller elements that are redacted or merged by the methods described above are merely modified so as to not contact their respective via surrounds, which effectively cuts them off from the live portions of the integrated circuit, while allowing them to be retained to provide structural support for the integrated circuit.

Thus, the various embodiments of the present invention enable appropriate integrated circuit designs to be integrated onto a common reticle set, so that they can be fabricated on a common substrate, even if they do not have the same number of layers within their respective conductive stacks. Thus, the costs associated with the tooling and fabrication of such integrated circuit designs are reduced. Further, the embodiments of the present invention provide solutions for capacitance and structural problems which may arise in the duplicated layers.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for integrating a first integrated circuit design having first layers and a second integrated circuit design having second layers into a common reticle set, where the second integrated circuit design has a given number of second layers and the first integrated circuit design has less than the given number of layers, the method comprising the steps of:
    iteratively duplicating at least one of the first layers to produce at least one duplicated first layer until the first integrated circuit design has the given number of first layers;
    mapping the first layers and the at least one duplicated first layer to a modified first integrated circuit design having the given number of first layers; and
    fabricating a reticle set to include the given number of first layers and the given number of second layers, using the modified first integrated circuit design and the second integrated circuit design.

2. The method of claim 1, wherein the first layers and the second layers are conductive stack layers.

3. The method of claim 1, wherein the first layers and the second layers include thin metal layers and via layers of conductive stacks.

4. The method of claim 1, wherein the duplicated at least one of the first layers includes a topmost of the first layers.

5. The method of claim 1, further comprising the step of selectively redacting first elements from the at least one duplicated first layer.

6. The method of claim 1, further comprising the steps of selectively redacting first elements from the at least one duplicated first layer and selectively adding second elements to the at least one duplicated first layer.

7. The method of claim 1, further comprising the step of selectively modifying first elements from the at least one duplicated first layer so that they do not make electrical contact with others of the first layers.

8. A method for integrating a first integrated circuit design having a first number of first conductive stack layers and a second integrated circuit design having a second number of second conductive stack layers into a common reticle set, where the first number is less than the second number, the method comprising the steps of:
    iteratively duplicating one of the first conductive stack layers to produce at least one duplicated first conductive stack layer until the first integrated circuit design has the second number of first conductive stack layers;
    mapping the first conductive stack layers and the at least one duplicated first conductive stack layer to a modified first integrated circuit design having the second number of first conductive stack layers; and
    fabricating a reticle set to include the second number of first conductive stack layers and the second number of second conductive stack layers, using the modified first integrated circuit design and the second integrated circuit design.

9. The method of claim 8, wherein the first conductive stack layers and the second conductive stack layers include thin metal layers and via layers.

10. The method of claim 8, further comprising the step of selectively redacting first elements from the at least one duplicated first conductive stack layer.

11. The method of claim 8, wherein the duplicated at least one of the first conductive stack layers includes a topmost thin metal layer.

12. The method of claim 8, further comprising the steps of selectively redacting first elements from the at least one duplicated first conductive stack layer and selectively adding second elements to the at least one duplicated first conductive stack layer.

13. A method for integrating a first integrated circuit design having a first number of first thin metal conductive stack layers and a second integrated circuit design having a second number of second thin metal conductive stack layers into a common reticle set, where the first number is less than the second number, the method comprising the steps of:
iteratively duplicating at least one of the first thin metal conductive stack layers to produce at least one duplicated first thin metal conductive stack layer until the first integrated circuit design has the second number of first thin metal conductive stack layers;
mapping the first thin metal conductive stack layers and the at least one duplicated first thin metal conductive stack layer to a modified first integrated circuit design having the second number of first thin metal conductive stack layers; and
fabricating a reticle set to include the second number of first thin metal conductive stack layers and the second number of second thin metal conductive stack layers, using the modified first integrated circuit design and the second integrated circuit design.

14. The method of claim 13, further comprising the step of selectively redacting first elements from the at least one duplicated first thin metal conductive stack layer.

15. The method of claim 13, wherein the duplicated at least one of the first thin metal conductive stack layers includes a topmost thin metal layer.

16. The method of claim 13, further comprising the step of selectively modifying first elements from the at least one duplicated first thin metal conductive stack layer so that they do not make electrical contact with others of the first thin metal conductive stack layers.

17. The method of claim 13, further comprising the steps of selectively redacting first elements from the at least one duplicated first thin metal conductive stack layer and selectively adding second elements to the at least one duplicated first thin metal conductive stack layer.

* * * * *